United States Patent

Metreaud

[15] 3,675,563

[45] July 11, 1972

[54] SEMICONDUCTOR PROCESSING APPARATUS

[72] Inventor: Claude G. Metreaud, Fishkill, N.Y.

[73] Assignee: International Business Machines Corporation, Armonk, N.Y.

[22] Filed: Jan. 15, 1970

[21] Appl. No.: 3,162

[52] U.S. Cl. ....................95/89 R, 118/319

[51] Int. Cl. ....................G03d 5/04

[58] Field of Search ....................95/89 R, 89 D, 89 G, 94 R, 95/94 G; 118/319, 326; 134/80, 81; 214/17 B

[56] References Cited

UNITED STATES PATENTS

| | | | |
|---|---|---|---|
| 3,059,560 | 10/1962 | Gutzmer | 95/89 R |
| 2,927,521 | 3/1960 | Smith | 95/89 X |
| 3,494,273 | 2/1970 | Kampf et al. | 95/93 X |
| 3,525,295 | 8/1970 | Mulvany et al. | 95/89 |
| 3,475,097 | 10/1969 | Bishop et al. | 355/91 |
| 3,528,358 | 9/1970 | Pickard | 95/89 |
| 3,392,707 | 7/1968 | Marx | 95/89 X |

*Primary Examiner*—Samuel S. Matthews
*Assistant Examiner*—Fred L. Braun
*Attorney*—Hanifin and Jancin and William J. Dick

[57] ABSTRACT

Apparatus for processing semiconductor wafers including an indexing turntable having a plurality of sets of radially slidable pickup heads connected thereto, the sets of pickup heads cooperating with a plurality of sets of process stations spaced about the turntable whereby the wafers held by one of the pickup heads of a set are moved into and out of alternate ones of the process stations during the process cycle. The apparatus also includes air slide conveyors for moving wafers into and out of registration with the vacuum type pickup heads, and also includes apparatus which enables, after one rotation of the turntable, the wafers processed in one group of process stations to be recycled into and out of the group of process stations not theretofor entered.

28 Claims, 16 Drawing Figures

INVENTOR
CLAUDE G. METREAUD
BY William J. Dick
ATTORNEY

SEMICONDUCTOR PROCESSING APPARATUS

SUMMARY OF INVENTION AND STATE OF PRIOR ART

The present invention relates to semiconductor wafer processing apparatus and more particularly relates to apparatus for automatically processing semiconductor wafers having a surface covered with photoresist upon which a pattern has been exposed.

After a doped semiconductor crystal is grown, the crystal is sliced into individual wafers, at least one surface of which is then lapped and polished to remove imperfections in that surface. After the polishing operation, the wafer is covered with a photoresist material such as Kodak's KPR (trademark) and a mask having a definite pattern is aligned superimposed of the sensitized surface. Light is then projected through the mask onto the sensitized surface, exposing the desired pattern on the sensitized surface of the wafer. After developing, depending upon the type of photoresist used, i.e. positive or negative photoresist, desired portions of the photoresist, such as the unexposed portions, are then washed away. Thereafter the wafer is dried for subsequent etching and then diffusion processing in, for example, a diffusion furnace.

In developing the exposed photoresist and then removing the unexposed photoresist, it is conventional practice to load a plurality of wafers into a tray and submerge the tray in a liquid such as a developer of technical xylene and methyl cellosolve acetate which is a KPR developer used in negative resist systems. In the instance of a positive photoresist system such as with the AZ-101 photoresist an AZ-303 developer, which is aqueous alkaline solution containing a detergent of the aklyl-arylsulfonate type, is used, both developer and photoresist being made by Shipley Company, Inc. of Newton, Massachusetts. Thereafter the basket is removed (assuming development is complete) and the basket is then submersed in a rinse solution, for example, with KPR, n-butyl acetate; for the AZ-303 a deionized water rinse having a high resistivity. After the material is washed away the wafers are then dried, for example, in an oven or the like.

The present processing of semiconductor wafers is slow and requires constant attention by one or more operators. In the conventional process outlined above the operators are exposed to the fumes from the highly volatile liquids which may be injurious to the health of the operator. Additionally, the great number of handling steps by the operator increases the opportunity for wafer breakage which, if the wafer has been almost completely processed, ie. a great number of diffusions, etc. on the wafer, increases the statistical probability of breakage and concurrent expensive loss.

In view of the above, it is a principal object of the present invention to provide a machine which rapidly and automatically processes semiconductor wafers having an exposed photosensitized surface.

Another object of the present invention is to provide a machine which automatically develops, rinses, and dries semiconductor wafers having an exposed photosensitized surface.

Still another object of the present invention is to provide a machine which is flexible so as to permit variations in the number of processing steps without necessitating lengthy downtime for machine changes.

Another object of the present invention is to provide a machine for automatically processing sensitized semiconductor wafers in which the processing steps are carried out under predetermined conditions but which conditions may be varied depending upon the type of photoresist material being used.

Yet another object of the present invention is to provide a machine which enhances the safety of an operator and avoids direct contact between the machine operator and the highly volatile liquids utilized for developing and rinsing exposed sensitized semiconductor wafers.

Another object of the present invention is to provide, in such a machine as above described, spray processing stations which prevent contamination of an area external to the process station thereby preventing area contamination and discomfort to personnel in and around the area.

Other objects and a fuller understanding of the invention may be had by referring to the following specifications and claims taken in conjunction in the accompanying drawings in which:

INTRODUCTION

Figure 1:
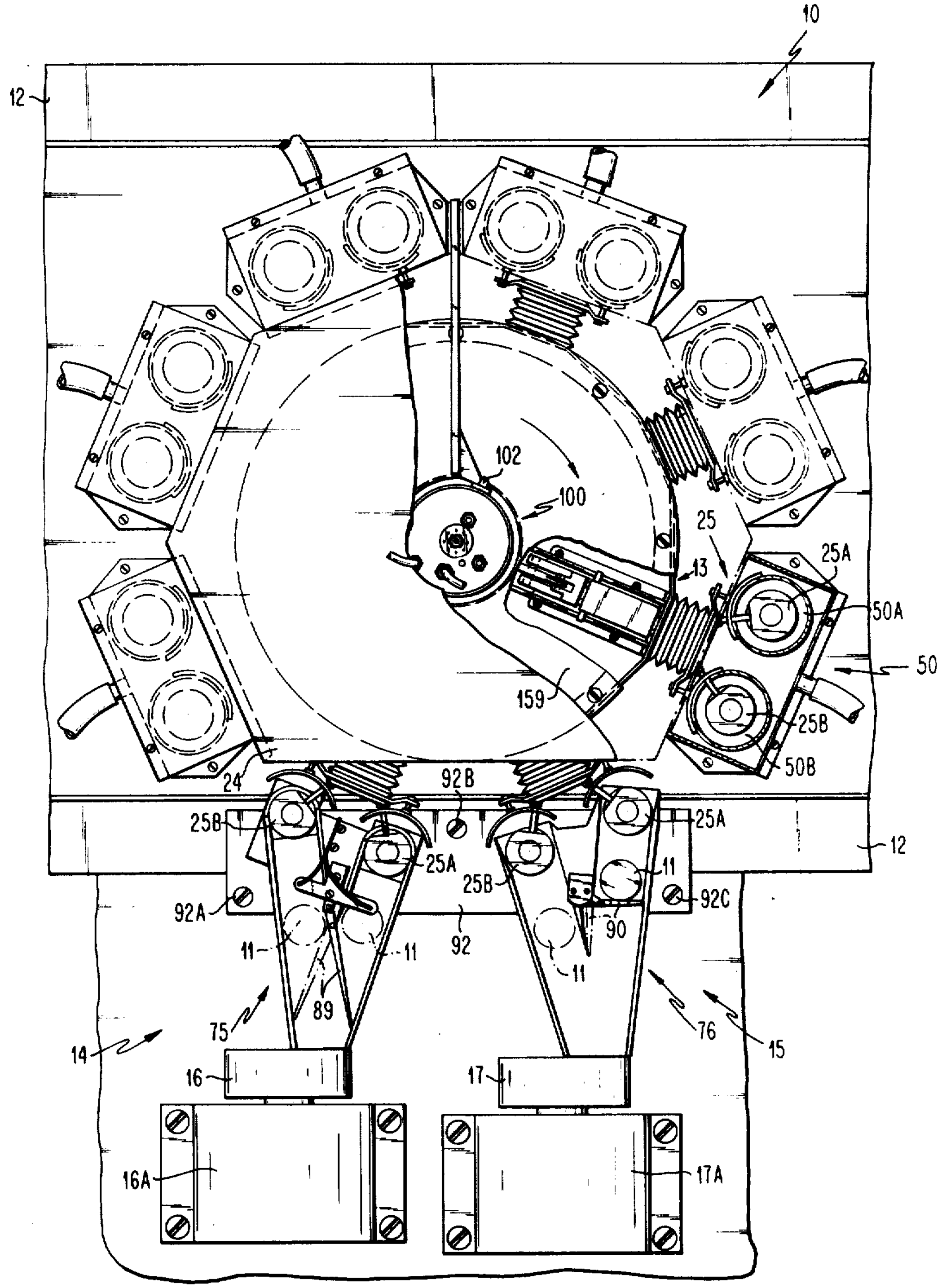
FIG. 1 is a fragmentary plan view of apparatus constructed in accordance with the present invention.

Referring now to the drawings, and especially FIG. 1 thereof, a machine 10 for processing semiconductor wafers 11 (shown in phantom) is illustrated therein. As illustrated, the machine generally comprises a frame 12 upon which is mounted an indexing turntable 13 including radially reciprocating sets of wafer pickup heads 25, each head being designated 25A, 25B respectively. Circumscribing the turntable 13 is a plurality of sets of process stations 50 into and out of which the wafer holding pickup heads move during the dwell portion of the indexing cycle of the turntable 13. As shown, each of the sets of processing stations includes first and second process stations 50A and 50B respectively, the indexing of the turntable being such that only the pickup heads 25A will enter into and egress from the process stations 50A, while the process stations 50B are only accommodated by the pickup heads 25B.

In order to load and unload wafers onto and out of the pickup heads for processing in the process stations and removal from the machine after processing has been completed, a load and unload station 14 and 15 respectively is provided, the load and unload stations including air slide conveyors 75 and 76 for moving wafers into registry with the pickup heads 25 for processing in the machine 10, and out of registry with the pickup heads upon completion of the processing steps.

As schematically shown in FIG. 1, in the present instance the air slides 75 and 76 feed and receive respectively wafers out of and into canted angular wafer carriers 16 and 17 which are indexed in synchronism with the dwell cycle of the turntable by indexing means 16A and 17A respectively.

In order to more fully understand the apparatus of the present invention, the specification has been broken down into five major headings, as follows: Air Slide Conveyors; Wafer Pickup Heads and Control; Indexing and Reciprocation Mechanism; Process Stations and; Machine Control.

AIR SLIDE CONVEYORS

Figure 7:
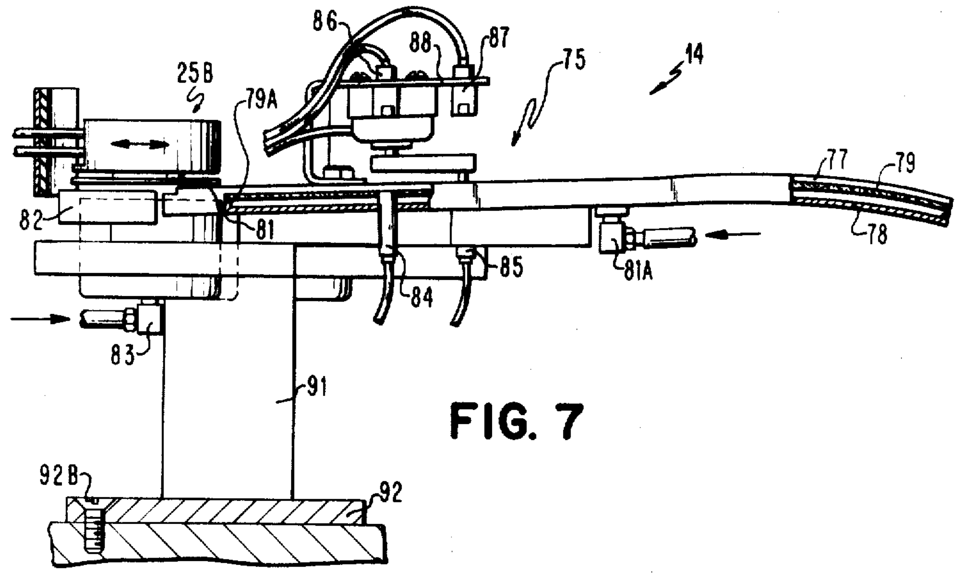
FIG. 7 is a fragmentary section side elevation of a portion of the apparatus illustrated in FIGS. 1 and 4.
Figure 8:
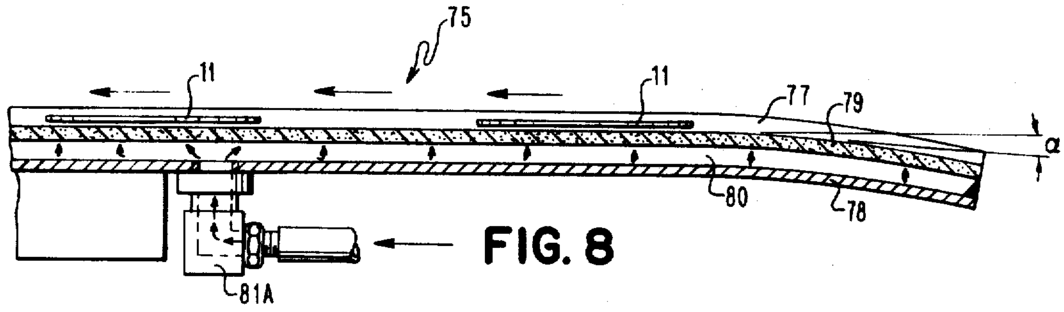
FIG. 8 is an enlarged fragmentary section view in side elevation of a portion of the apparatus illustrated in FIG. 7.

As described above, the air slide conveyor 75 and 76 operate to receive and supply respectively, wafers from and to the canted angular wafer carriers 16 and 17. To this end and referring first to FIG. 4, each of the air slide conveyors 75 and 76 includes a bifurcation having first and second legs respectively designated 75A and 75B, 76A and 76B to supply to and receive wafers from the pickup heads 25A and 25B. As best shown in FIG. 7 and 8, the load air slide conveyor 75 comprises a channel having upstanding side walls 77 and a bottom wall 78 superimposed of which and spaced therefrom is a foraminous bottom wall 79 forming a plenum chamber 80 between the walls. As shown in FIG. 7, air is provided to the chamber 80 by a nipple and union 81A, the air in the plenum chamber 80 being forced through the foraminous wall 79 to create a thin film of air upon which the wafers 11 may float. As shown in FIG. 8, it is preferable that the conveyors be sloped, in the illustrated instance, the angle Alpha, an angle between horizontal and a projected plane of the foraminous wall 79 being, approximately 1°–4°. Of course, in a like manner the unload slide conveyor 76 is sloped in the reverse direction so that wafers being unloaded at the unload station tend to slide toward the wafer carrier 17. For reasons which will be more fully explained hereinafter, the wafers are floated on the film of air with their sensitized surface facing downwardly.

In order that individual wafers may arrive at a position at the load station 14 for pickup by the pickup heads 25, means are provided for bringing the wafer to rest, at the loading station 14, adjacent to but spaced slightly from the superimposed pickup heads. To this end and as best illustrated in FIG. 7, the foraminous wall 79 has a terminal end 79A adjacent a recessed portion 81 which underlies the pickup heads when in their extended position. The recessed portion 81 is in a plane parallel to the plane of the lower surface of the pickup head (hereinafter described) but closely spaced therefrom. To prevent override of a wafer as it leaves the terminal end 79A of the conveyor 79, a guard rail 82 circumscribes the recess 81 while the recess is also supplied with air pressure as through the union 83, thereby elevating the wafer and preventing the lower sensitized surface of the wafer from being contacted by a metallic part or other implement which may damage the surface.

Initiation of the cyclic operation of the machine 10, after a wafer has been placed on the inlet air slide conveyor 75 is caused by wafer responsive means in the present instance, the wafer triggering a photocell as it passes down the inlet conveyor 75. To this end and as best shown in FIG. 7, photocells 84 and 85 are positioned in the foraminous wall 79 associated respectively with each of the legs 75A, 75B of the conveyor 75. Immediately above the photocells and aligned therewith are filtered light means 86 and 87 which are held in a bracket 88 connected to the machine. It is important that the photocell be positioned beneath the wafer and the light superimposed thereof to prevent unintentional exposure of the unexposed portions of the sensitized surface on the wafer (see FIGS. 4 and 7).

Figure 4:
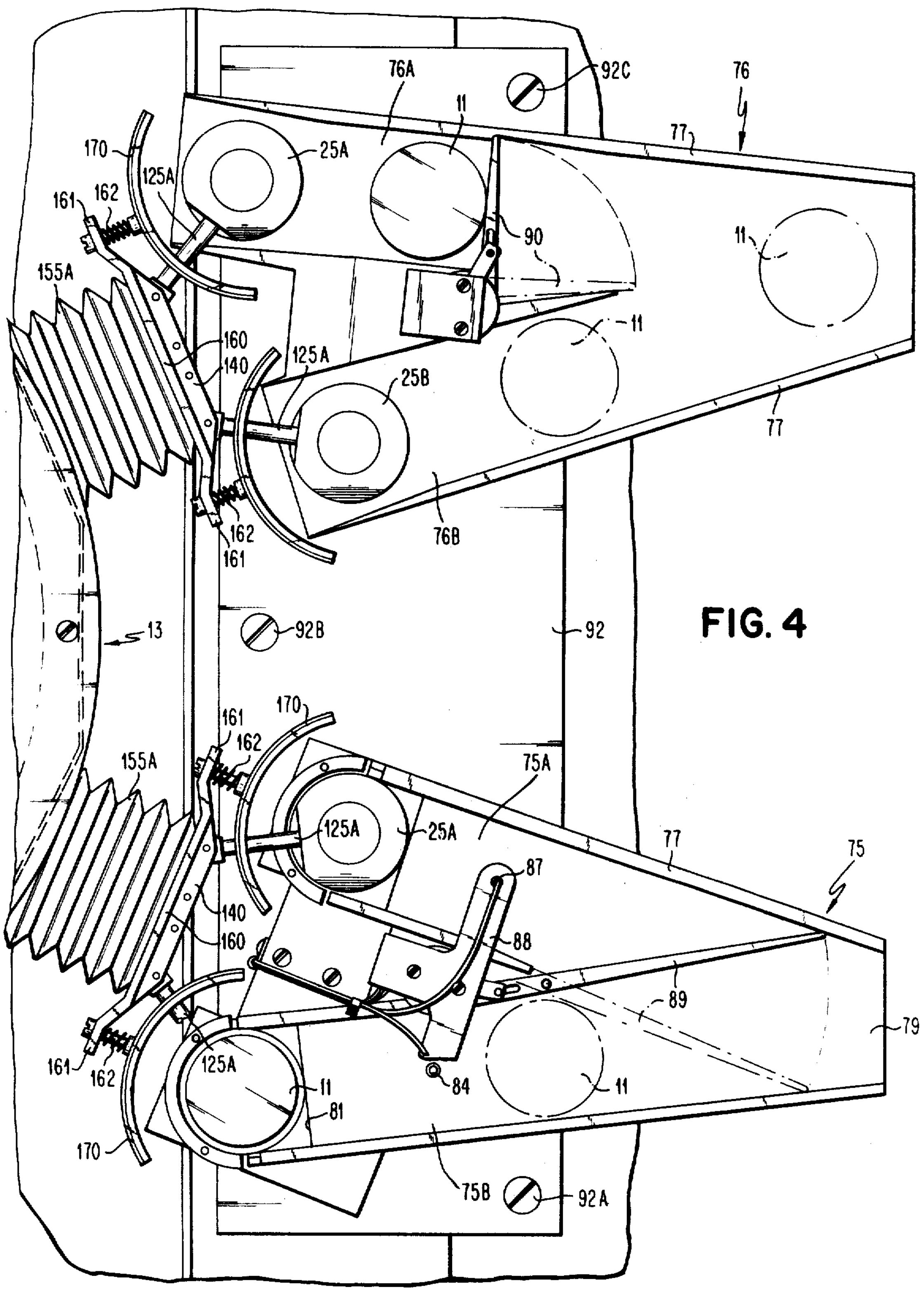
FIG. 4 is an enlarged fragmentary plan view of a portion of the apparatus illustrated in FIG. 1.

In a manner which will be more fully explained under Machine Control, a gate 89 serves, through machine control programming, to permit loading of the pickup head 25B and subsequent loading of pickup head 25A by directing the wafer 11 first up the leg 75B, the gate being in the position shown in FIG. 4, and then permitting a sensitized wafer to move up leg 75A by movement of the gate to the position shown in phantom lines in FIGS. 1 and 4.

In a like manner, to prevent the wafers, when unloading, from striking one another and thus risk damage to the wafers, a gate 90 is positioned at the junction of the legs 76A and 76B to hold the wafer discharged in leg 76A at the unload station 15 until the wafer in the leg 76B is farther down the conveyor 76. Both gates 89 and 90 may be controlled by rotary solenoids and the like means.

For purposes which will be more fully appreciated hereinafter, it is preferable that the air slide conveyors 75 and 76 be made easily removable by, for example, mounting the slides on a post 91 attached to an easily removable plate 92. As best illustrated in FIG. 4 the plate 92 may be easily removed and replaced as by the screws 92A, 92B, and 92C.

WAFER PICKUP HEADS

Figure 9:
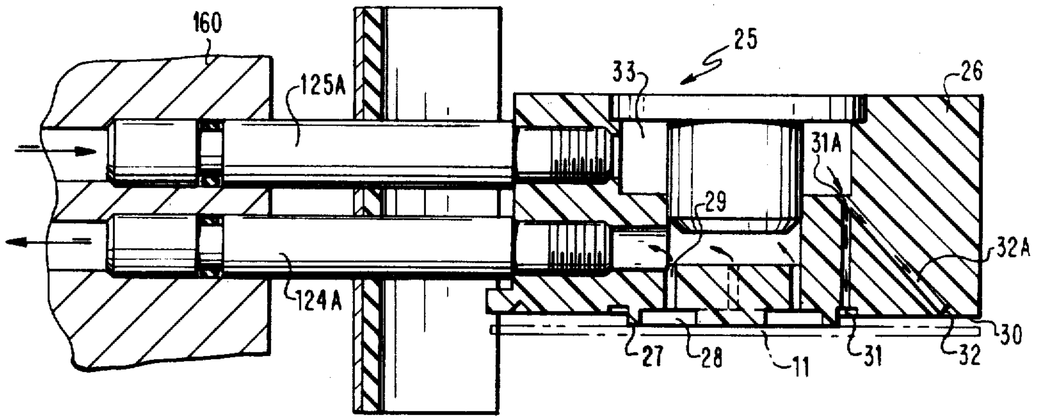
FIG. 9 is a fragmentary enlarged side elevational view of a portion of the apparatus illustrated in FIGS. 1, 2, 3, and 4.

Each set 25 of pickup heads 25A and 25B are used to pick up and hold wafers 11 for movement into and out of the sets of process stations 50, in the present instance the pickup heads being adapted to hold the wafer in a position for processing in the process stations while protecting the wafer from chemical pollution of the unsensitized surface thereof. To this end and as best shown in FIG. 9, each pickup head comprises a block 26 having a protruding depending pickup face 27 surrounded by an annular recessed face portion 30, the pickup face 27 communicating through a ring-like recess 28 with a vacuum conduit 29. Thus a wafer 11, (shown in phantom in FIG. 9) held by the pickup face 27 is spaced from a recessed face portion 30. The annular recessed peripheral face 30 includes a pair of concentric recesses 31 and 32 which are subjected to a positive air pressure via conduits 31A and 32A respectively. As illustrated in FIG. 9, the conduits 31A and 32A communicate with a chamber 33 to which is applied a positive air pressure. In this manner, the pressurized air maintains the recessed area or face 30 and thus the rear surface of the wafer 11 free of contaminants both during transport and processing of the sensitized lower surface of the wafer without destroying the vacuum coupling between the wafer and the face 27.

It should be noted that the vacuum pickup with air shield, described above, is more fully set forth in U.S. Patent application Ser. No. 737,680 filed on June 17, 1968, now U.S. Pat. No. 3,517,958, the application being owned by the assignee of this application.

Figures 2, 3:
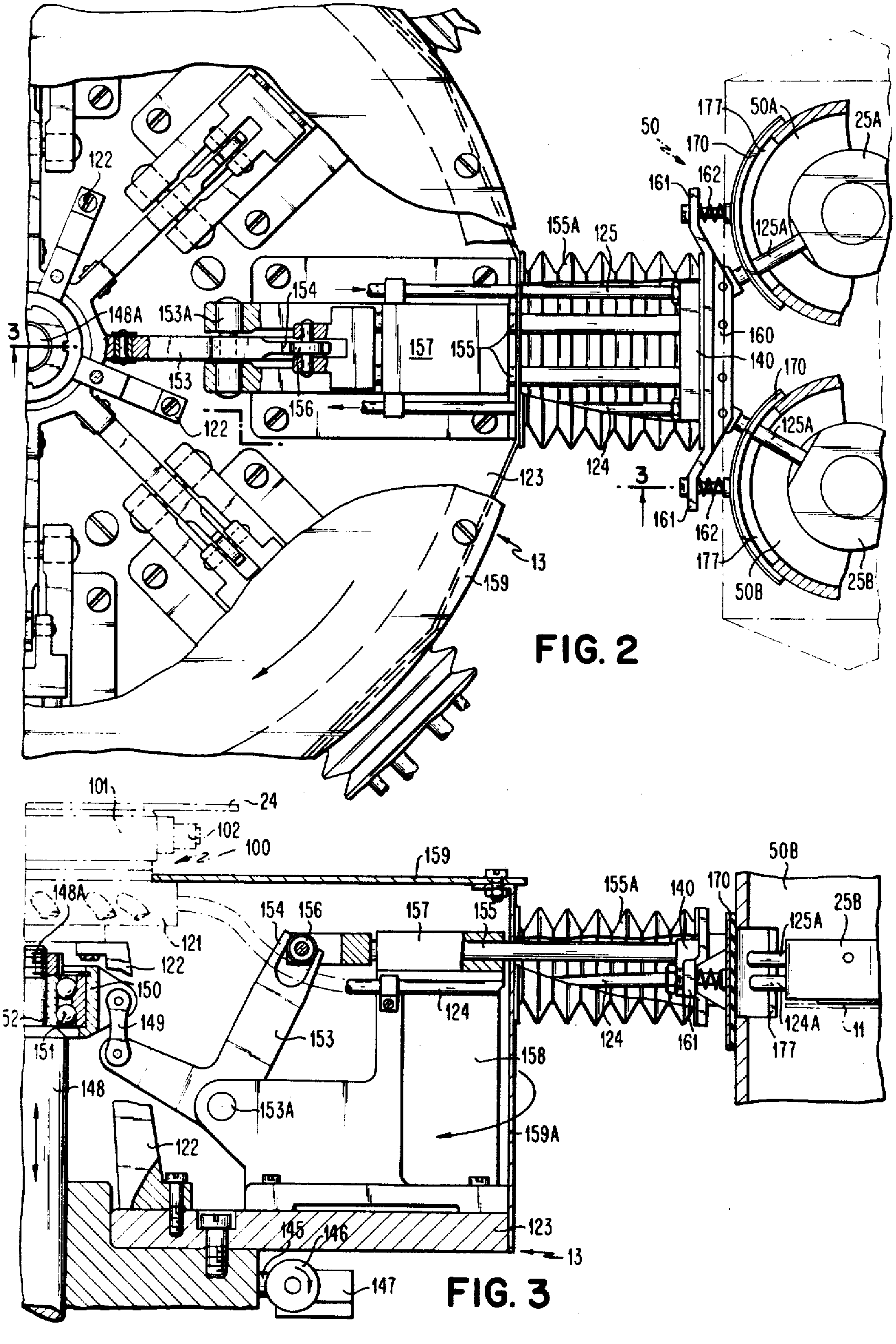
FIG. 2 is an enlarged fragmentary view of a portion of the apparatus illustrated in FIG. 1.
FIG. 3 is a fragmentary side elevational sectional taken along line 3—3 of FIG. 2.

Inasmuch as the pickup heads 25A and 25B are coupled together forming a set, a single air and a single vacuum line may be used and then split to supply both pickup heads of a set. To this end, and as best shown in FIGS. 2 and 9 a flexible vacuum hose 124 and a flexible air hose 125 is connected to an air distributor 140 which splits each line to service each of the heads 25A and 25B, as through passageways 124A and 125A (see FIG. 9).

Figure 5:
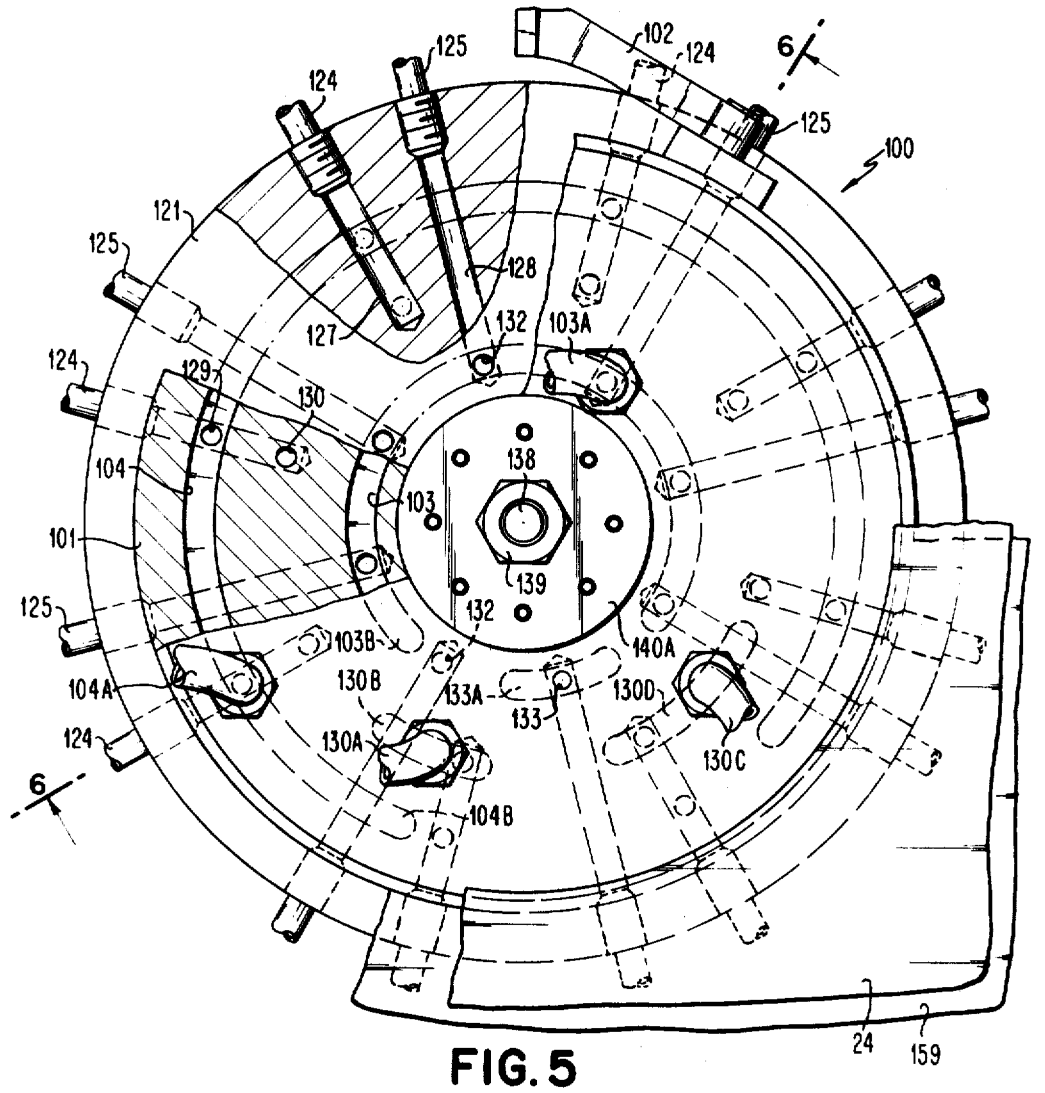
FIG. 5 is an enlarged fragmentary sectional view of a portion of the apparatus illustrated in FIGS. 1, and 3.
Figure 6:
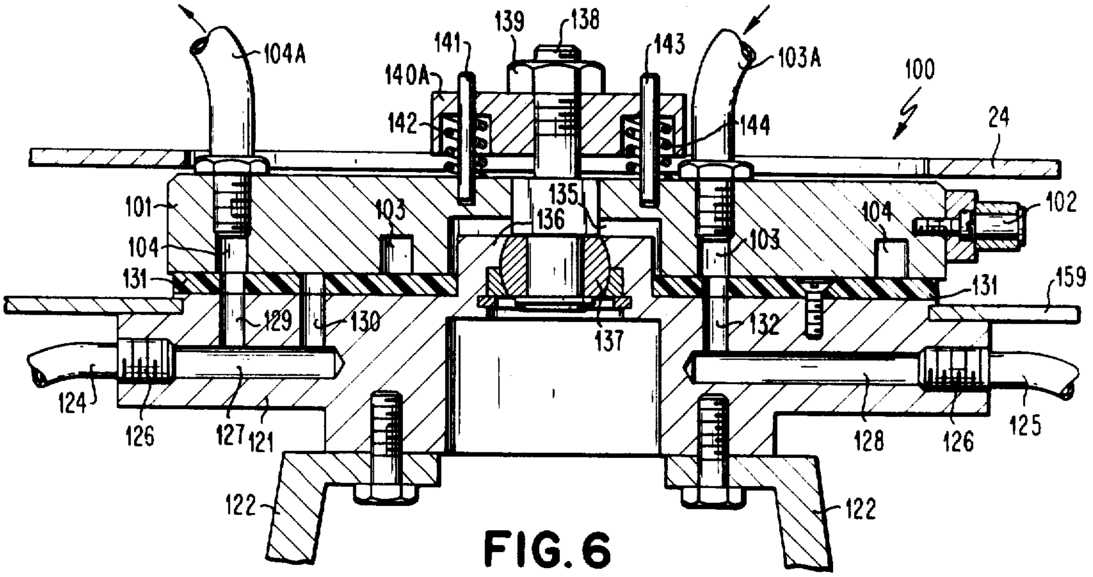
FIG. 6 is a fragmentary sectional view taken along line 6—6 of FIG. 5.

As the turntable 13 indexes in the direction of the arrow shown in FIG. 1, and the wafer pickup heads 25 move into the process stations 50 between the load and unload stations 14 and 15 respectively, it is necessary to provide means for turning on air and vacuum and cutting off vacuum for holding the wafer and maintaining its reverse side free of contaminants during indexing and processing. To this end, and as best illustrated in FIGS. 1, 5, and 6, an air manifold 100 is provided for supplying air and vacuum to each of the pickup heads of each of the sets during predetermined times as the turntable 13 revolves. As illustrated, the air manifold 100 is positioned at the upper portion of the machine underlying a cover 24, the manifold comprising first and second plate members 101 and 121, the upper plate member 101 being secured to the frame 12 of the machine as by torque restraining means 102 (see FIGS. 1, 5, and 6). The lower plate member 121, on the other hand, is connected by a bracket 122 to the rotating turntable 13, in the illustrated instance and as best shown in FIG. 3 to a base ring 123 which forms part of the turntable 13. Thus, the lower plate member 121 rotates relative to the fixed first or upper plate member 101. As shown in FIGS. 5 and 6, each of the sets of vacuum heads 25 has the vacuum hose 124 and air supply hose 125 connected as by a screw fitting 126 to the lower plate member 121. For example, each of the hoses 124 connects to a radial passage 127 in the plate 121 while each of the hoses 125 connects to a radial passage 128 of greater depth in the plate 121 than the passages 127. Each of the passages 127 associated with the vacuum hoses 124 includes a pair of radially spaced substantially axially extending passages 129 and 130 for extending through a low friction disc 131 sandwiched between the upper plate 101 and lower plate 121. In a like manner, the passage 128 associated with each of the positive air pressure hoses 125 includes a single perpendicular passage or conduit 132 which extends through the disc 131.

In order to permit communication of vacuum and air to the vacuum hoses 124 and pressurized air hoses 125 respectively, the upper or first plate 101 includes a pair of circumferentially extending annular slots 104 and 103, the slot 104 communicating with the passage 129 and thereby connected to the vacuum hoses 124, while the slot 103 communicates with the passages 132 and thus the air pressure hoses 125. In order to provide a vacuum to slot 104 and a positive air pressure to slot 103, a suction nozzle fitting 104A is connected to the fixed plate 101 communicating directly with the slot 104 while an air supply fitting 103A is connected to the slot 103, also through the first plate 101. For reasons which will become more evident hereinafter, a second vacuum pressure line 130A is connected to the fixed plate 101, and communicates with a limited arcuate slot (shown in phantom in FIG. 5) 130B in the lower surface of the plate 101. The slot 130B is adapted for registration with the passage 130 (see FIG. 6) which is connected to the vacuum hose 124 through the passage 127. In a like manner, a tertiary vacuum/air line 130C is connected to the upper plate 101 and communicates with a short arcuate slot 130D in the lower surface of the plate, the slot being adapted for registration also with the vacuum line 124 when the sets of pickup heads 25 register with the unload station 15.

As illustrated, upon a wafer being positioned in the recess 81 adjacent the terminal ends 79A of the foraminous wall 79, it is desirable that the pickup heads 25 are inactive, that is that no air or vacuum be applied until the wafer has come to rest in the recess. In this manner turbulence at the load station 14 is prevented. That is the reason, as appears in FIG. 5, that the arcuate slot 104 has a terminal end 104B arcuately spaced from the vertical passage 129 which normally registers the vacuum hose 124 to draw a vacuum on the pickup head 25. In a like manner and as best illustrated once again in FIG. 5, the air pressure slot 103 has a leading terminal end 103B which is arcuately spaced from the vertical passage 132 associated with the air pressure hose 125.

Upon the wafer coming to rest in the recess 81 and just prior to movement of the turntable so that the pickup heads 25 enter the first set 50 of process stations, a valve (not shown) is actuated causing a suction to be created on hose 130A and creating a vacuum thereby on vacuum hose 124. In this manner the pickup heads are energized with vacuum and the wafer is drawn up to the head into a position as illustrated in FIG. 9.

Upon the turntable 13 rotating from the load station 14 into the first set 50 of process stations, the slot 104 now registers with the passage 129 associated with the vacuum hose 124, and until the slot 104 terminates a vacuum is applied to the pickup head. Additionally, as the turntable commences its rotation, the passage 132 registers with the slot 103 at which time the air pressure hose 125 is provided with positive air pressure.

In a like manner, after the pickup heads have completed one rotation the suction slot 104 is terminated adjacent the unload station 15 and the vacuum/air hose 130C is energized as by a valve (not shown) which draws a vacuum on the wafer through the registering passage 130 which communicates with the vacuum hose 124. Upon the pickup heads reaching a dwell superimposed of the discharge conveyor 76 legs 76A and 76B, a positive pressure is supplied to the hose 130C and the wafer is discharged onto the conveyor 76. It should be noted that a vent aperture 133 and slot 133A is provided for registry with the passage 132 when the pickup heads are at the unload station.

To permit attachment and pressurizing of the plate 101 against the plate 121, while compensating for any misalignment between the two, the plate 101 is provided with a central recess 135 which cooperates with a hub 136 on the bottom plate 121. Pivotally connecting the hub 136 to the plate 101 is a ball 137 through which is passed a bolt 138 the nut 139 of which is spring-biased outwardly by a biasing ring 140A including pins 141 and compression spring 142, pin 143 and compression spring 144. In this manner, the pressure between the plates 101 and 121 may be adjusted to apply the initial pressure between the plates.

INDEXING AND RECIPROCATION MECHANISM

The indexing mechanism and the drive for the reciprocation mechanism is a commercial unit which may be purchased from the Ferguson Machine Company which has a home office at Maplewood Industrial Court in St. Louis, Mo. 63143. Inasmuch as the drive is a standard purchasable item, only so much of it is illustrated in the drawings and described below as is necessary for understanding.

The indexing drive mechanism includes drive means which are adapted to engage cam-type lobes which are connected in the present instance to the base ring 123 (see FIG. 3). As shown schematically in FIG. 3, a plurality of lobes 145 corresponding in number to the desired number of indexes for one rotation of the base ring 123 are equally spaced about the circumference of the base ring 123. Driving the lobes is an intermittor 146 which is in essence an interrupted worm-gear, the intermittor being driven as by drive means, in the illustrated instance an electric motor 147. Although not shown in the drawing, the drive means is also connected through a cam to a shaft 148 located centrally of the machine to effect reciprocation of the shaft.

In order to effect radial reciprocation of the pickup heads, means are provided for coupling the pickup heads to the shaft 148 whereby during portions of the cycle the pickup heads of one set will be introduced serially into the sets of process stations, as well as the load and unload station. To this end, and as best illustrated in FIGS. 2 and 3, a toggle 149 is connected to an outer race 150 of a bearing 151, the inner race 152 of which is connected to a portion 148A of the shaft 148. The toggle 149 is in turn pivotally connected to a bell crank 153 as at 153A, and through a yoke 154 to a pair of radially extending and reciprocatable shafts 155 via a pivot pin 156, the shafts being slideably disposed in a bearing block 157. As illustrated in FIGS. 2 and 3, the bearing block 157 is connected by post 158 to the base ring 123 so that as the base ring rotates due to the indexing and drive mechanism, and the shaft 148 reciprocates, the laterally extending shafts 155 will reciprocate in the radial plane.

For cleanliness and safety a drive cover 159 having an upstanding circumferentially extending portion 159A is connected to the base ring, covering the reciprocating pickup head shafts 155 and mechanism and rotatable with the base ring 123.

The pickup heads 25 are connected to the radially reciprocating shafts 155 through the manifold 140 and a support bracket 160. As illustrated in the drawings, the bracket 160 is connected to the extensions 125A and 124A which are connected to the pickup heads 25A and 25B respectively. As shown in FIGS. 1–3, the shafts 155 and hoses 124 and 125 are covered by an extensible cover means, in the present instance the cover having the shape of a bellows 155A. Additionally, and for purposes which will be more fully explained in the following section entitled "Process Stations", a segmented arcuate sealing member 170 is connected to each of flared wings 161 of the bracket 160, the connection including spring biasing means 162 to permit limited radial movement (with respect to the turntable 13) of the sealing members 170.

PROCESS STATIONS

Each of the process stations 50A and 50B of the set 50 are adapted for spraying or otherwise supplying a treating medium onto the lower surface of the wafer. For example, referring first to FIG. 1 it may be desirable looking at the first set of process stations starting at the left and proceeding clockwise, to provide in that station a spray of developer fluid, in the second station (proceeding clockwise) a spray of rinse, in the third station another spray of developer, in the fourth station another spray of rinse, and in the fifth and sixth stations a supply of heated air or other drying gas for drying the wafers prior to their discharge from the pickup heads at the unload station 15.

Figure 10:
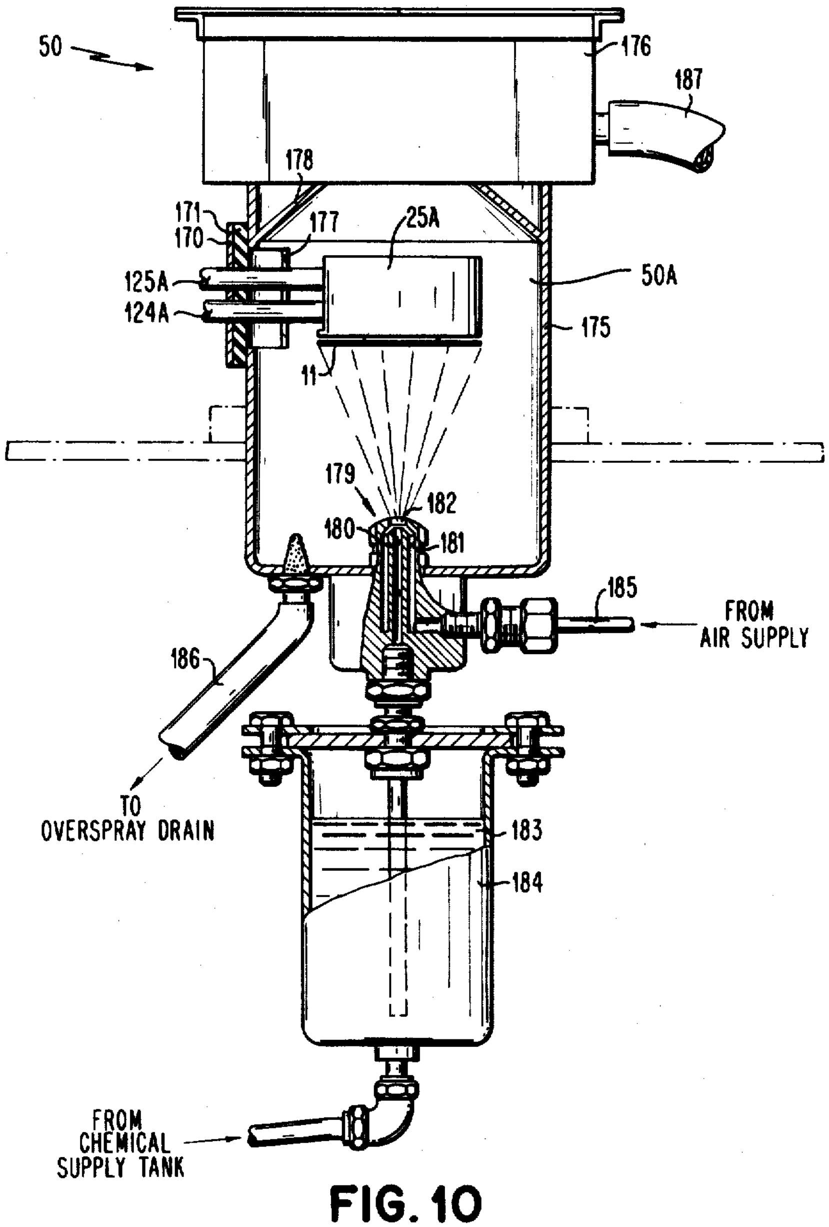
FIG. 10 is a fragmentary side elevation of another portion of the apparatus illustrated in FIGS. 1–3.

Referring first to a typical process spray station, as best shown in FIG. 10 each of the spray process stations comprises a chamber 175 including a common hood 176 which couples the upper portion of each of the process stations of a set. Each of the chambers 175 includes an entrance 177 dimensioned to receive one of the pickup heads 25 of a set therein. In the upper portion of the chamber 175 is baffle means 178 which extend circumferentially of the interior of the chamber, the baffle means being spaced above the entrance 177 for purposes which will become more evident hereinafter.

In order to supply a liquid spray to the lower surface of the wafer, for example, it is desirable that an atomizing spray means be positioned in the lower portion of the chamber so that the spray is directed upwardly against the lower surface of the wafer thereby permitting excess quantities of the liquid to fall by gravity and be removed from the bottom of the chamber. To this end and as best shown in FIG. 10 an atomizing spray head 179 including a central liquid aperture 180 and a surrounding annular air chamber 181 merging into a nozzle orifice 182, pulls liquid, for example developer or rinse 183, from a liquid supply reservoir 184 and directs a spray of the liquid onto the wafer held by the head. As illustrated, air is supplied to the head 179 through an air supply line 185.

To remove excess liquid from the chamber, an overspray drain 186 is connected to the lower portion of the chamber, the overspray being removed from the bottom of the chamber for either rework or for disposal. As described above the baffles 178 serve to deflect any spray bypassing the wafer 11 held by the wafer pickup head 25, causing the liquid to flow down the interior wall of the chamber to the overflow drain.

Inasmuch as the air supplied with the liquid for atomization purposes must be discharged, which discharge can carry volatile fumes, an exhaust lead or hose 187 is connected to the rear of the hood 176 to remove such gases.

Upon the wafer pickup head moving into the chamber 175 through the entrance 177 the arcuate sealing member 170, which includes a soft foam face 171, covers the entrance 177 to inhibit any liquid spray and fume discharge from the chamber 175. It should be recognized that the timing of the spray onto the lower surface of the wafer 11 is effected both as to start and stop time by controlling the air supply 185, which control will be discussed in the section "Machine Control."

Although not shown in the drawings, the wafers may be dried in one or more of the process stations by simply removing the spray nozzle and replacing it with a drying gas supply such as a heated air supply so as to effect a flow of heated gaseous media against the surface of the wafer.

In instances where it is desired to increase the number of process stations through which the wafer passes than are available in the illustrated apparatus heretofor described, inasmuch as the wafers held by the pickup heads 25A only enter the process stations 50A, while the wafers held by the pickup head 25B only enter the process stations 50B, this limits the number of processing steps to the number of sets of process stations, in the present instance six. Inasmuch as each of the process stations 50A, 50B of a set 50 are individually controllable as to the liquid they contain, amount of liquid supplied, time of spray exposure, etc., a modification of the conveyor system will enable the processing of the wafers first through the process stations 50B and then through the process stations 50A.

Figure 4A:
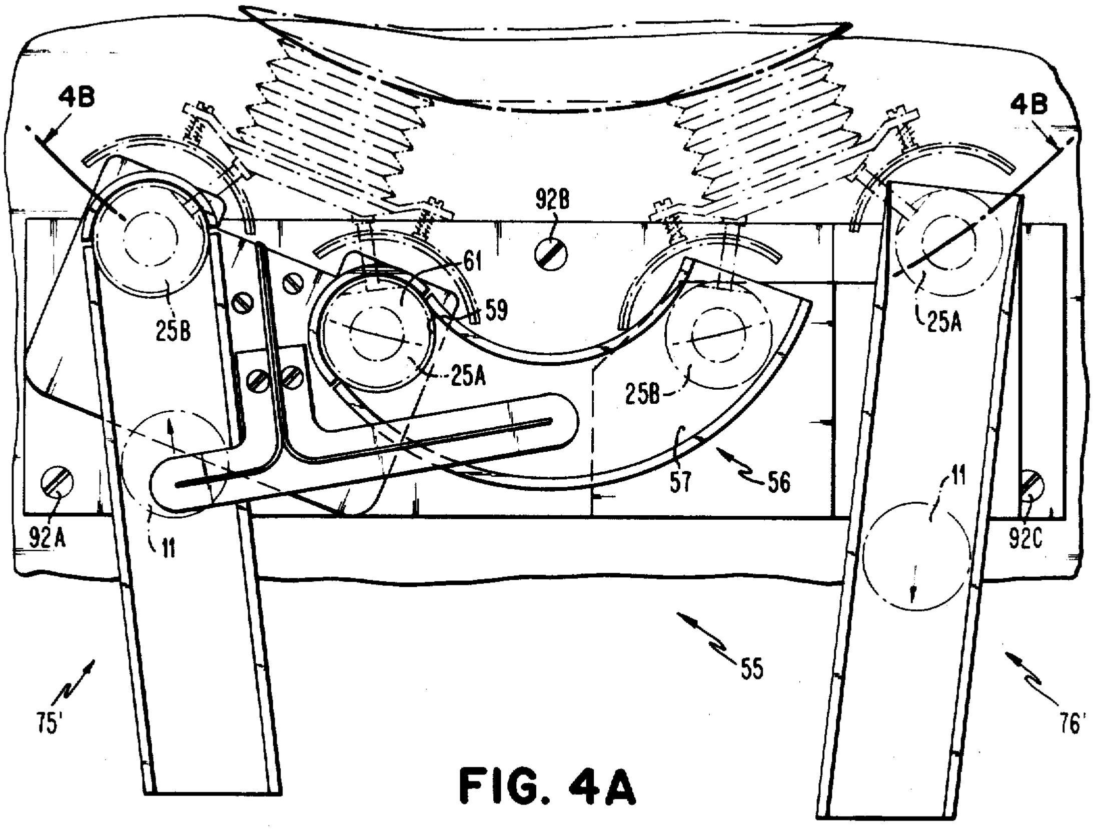
FIG. 4A is a plan view of an alternate embodiment of the apparatus illustrated in FIG. 4, and constructed in accordance with the present invention.
Figure 4B:
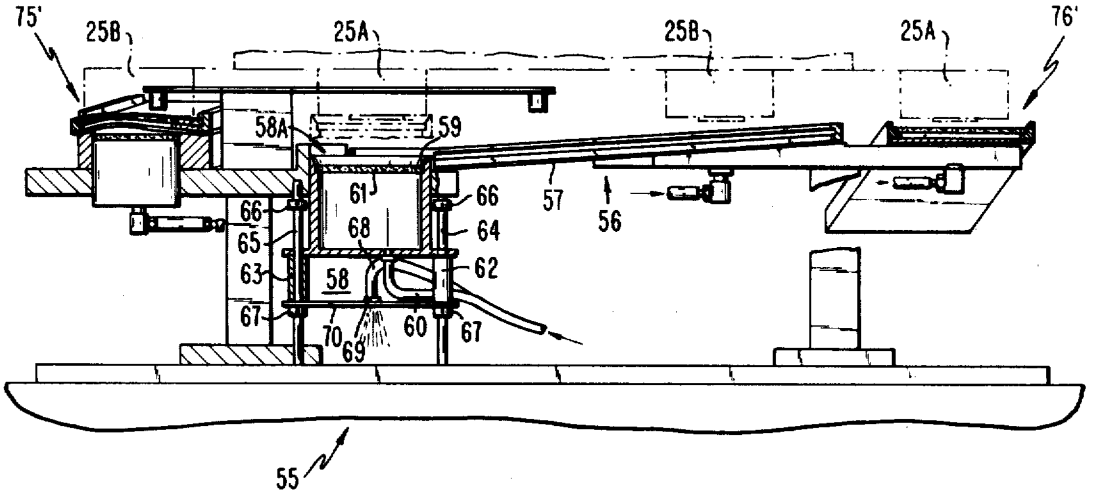
FIG. 4B is a fragmentary side elevational view of the apparatus illustrated in FIG. 4A.

To this end, and as best shown in FIGS. 4A and 4B the plate 92 upon which is mounted the conveyors 75 and 76 may be removed by removing the screws 92A–92C. In this manner, a new conveyor shunt apparatus 55 may be set into place and substituted for the conveyors 75 and 76. The apparatus 55 comprises an inlet air slide conveyor 75' and an outlet air slide conveyor 76', the inlet air slide conveyor 75' being adapted to place a wafer beneath the pickup head 25B of the set 25, while the outlet air slide 76' is adapted to receive the discharged wafer from the pickup heads 25A. Referring first to FIG. 4A, a wafer picked up first by the pickup head 25B will be processed through the process stations 50B until the wafer reaches the normal outlet or unload position. Upon the wafer being unloaded onto a shunt conveyor or slide 56, the wafer will be shunted from the pickup head 25B via the shunt slide 56 into a position underlying the pickup head 25A. Thereafter the pickup head 25A will carry the wafer through the process station 50A until the unload air slide conveyor 76' is reached and the wafer will then be discharged. Thus, the number of process steps available for processing an individual wafer is double that which is available in the first described embodiment.

Inasmuch as the wafer described from the pickup head 25B must be rapidly moved to the pickup head 25A for subsequent processing, it is mandatory that the shunt air slide 56, which is similar to the air slides 75 and 76 heretofor described, has a foraminous bottom wall 57 having a slope which is sufficiently great to effect rapid transportation of the wafer from the discharge pickup head 25B to a position underlying pickup head 25A. Additionally, in order to effect rapid elevation of the wafer into a position for pickup by the pickup head 25A, a novel reaction propelled elevator 58 is provided, the elevator serving to move the wafer upwardly until it is positioned adjacent the vacuum face 27 (see FIG. 9) of the pickup head.

To this end, and as best shown in FIG. 4B the reaction propelled elevator comprises a platform 58A having a recessed upper portion 59 for receiving therein a wafer 11 from the shunt slide 56. The platform 58A includes an air supply means 60 for providing a film of air through a foraminous plate 61 at the lower surface of the recess 59 thereby forming a film of air upon which the wafer received from the air slide 55 may be supported. As illustrated, the platform is vertically reciprocable and may be elevated into a position shown in phantom lines to permit wafer pickup by the pickup head 25A, the platform being moved between a first or rest position shown in full lines and a second elevated position shown in phantom lines. As illustrated in FIG. 4B, the platform includes a plurality of outboard tubes, as best seen in FIG. 4B, four tubes 62 and 63 through which is passed guide rods 64 and 65. Mounted on the guide rods are upper and lower limit stops 66 and 67 respectively, which stops are adjustable so as to permit accurate positioning of the platform 58 at its first and second position.

In order to elevate or move the platform from its first to its second position, a flexible hose 68 having an outlet end 69 which faces downwardly, is connected to a lower plate 70 of the platform 58. Air to the hose 68 is controlled by a valve (not shown) so that upon opening the valve, an air jet is formed causing the platform 58 to be elevated to its second position underlying the pickup head 25A.

MACHINE CONTROL

The control section of the machine operates to control (1) loading of wafers 11 onto the pickup heads 25, (2) sensing and recording the presence and location of wafers 11 at the several process stations 50, (3) activating spray processing in the desired process stations 50 at the proper time, and (4) starting and stopping the indexing cycle of the machine.

Figures 12, 12A:
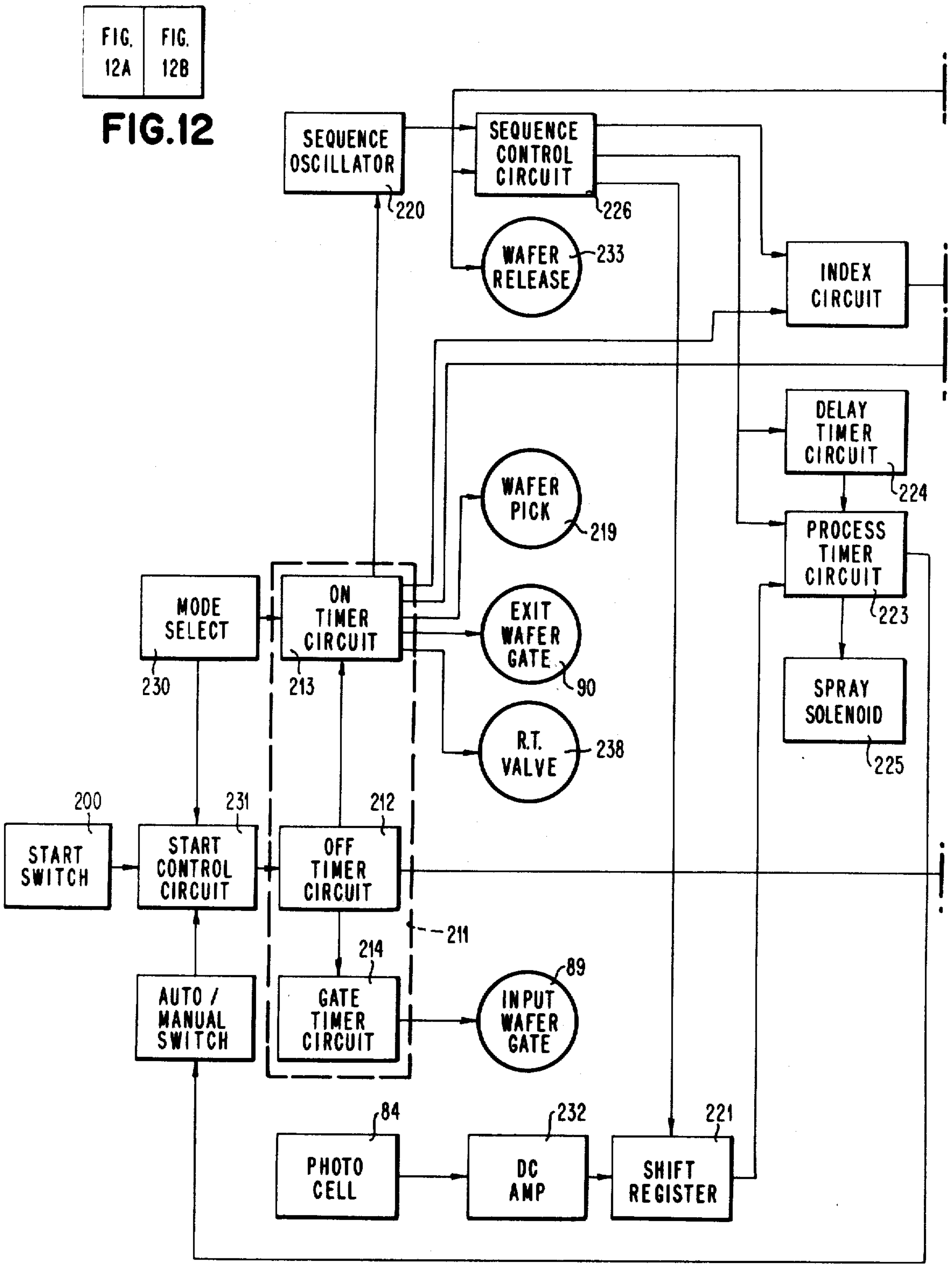
FIG. 12 is a composite block diagram created by joining FIGS. 12A and 12B.
FIG. 12A is a schematic of a portion of the control circuit shown in block form in FIG. 12.
Figure 12B:
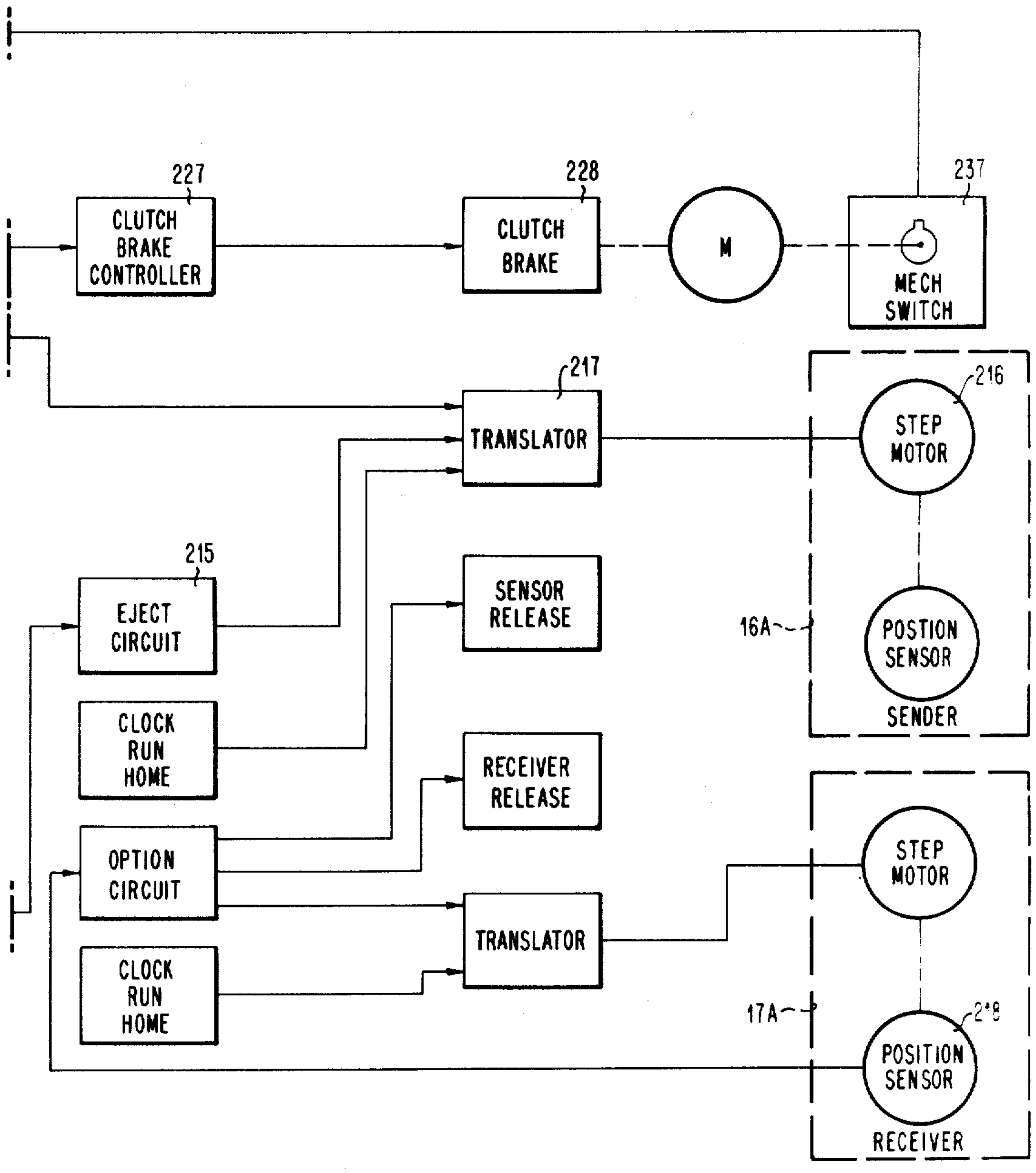
FIG. 12B is a schematic of the remainder of the control circuit shown in block form in FIG. 12.

It should be recognized that the machine control circuits, shown schematically in FIG. 12, may be implemented in numerous forms. These comprise electromechanical relay logic, solid state logic with discrete semiconductor components, integrated circuit logic, or hybrid forms combining two or all three of these.

Figure 11:
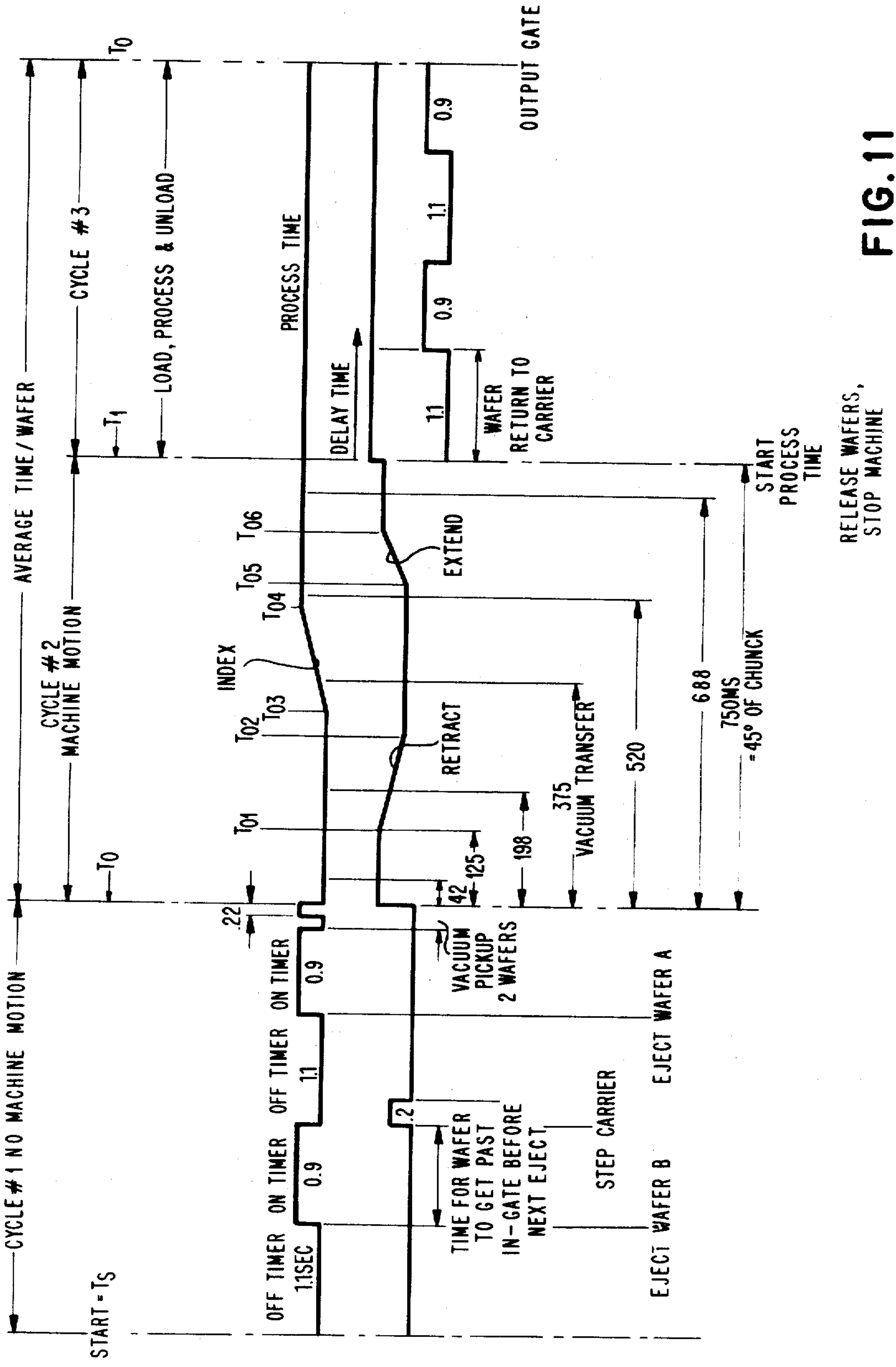
FIG. 11 is a schematic cycle diagram showing the timing of the machine and the manner in which the processing steps occur.

The timing diagram for control of the processing machine is shown in FIG. 11. This diagram relates to machine operation wherein wafers 11 are loaded and unloaded in pairs for processing through the various stations 50. While the time intervals employed have been found satisfactory for these particular processes and construction, they may be varied to suit the process.

The timing diagram, FIG. 11, is basically comprised of three periods or cycles.

The first cycle runs for approximately 4 seconds from $T_s$ to $T_1$, and is not repeated. During this time, the operation is started, but there is no motion of the machine except for wafer movement; that is, the mechanism for indexing and reciprocating the eight radial arms is inactive. During this period, wafers 11 are loaded onto air slide conveyors 75 and picked up by pickup heads 25.

The second cycle relates principally to the indexing motion of the machine during which time the pickup heads 25 are retracted, the machine indexes 45°, and heads 25 are extended into the process stations 50. This cycle begins at $T_0$ and ends at $T_1$. Electrical functions also occur during this period that will be described later.

The third cycle, from $T_1$ to $T_0$, is similar to the first in that wafers 11 are loaded onto a pair of empty pickup heads 25. Additionally, processing is performed during this period, and when pickup heads 25 are full, wafers 11 are released for return to the carrier 17. Thereafter, the machine cycles repetitively from $T_0$ through $T_1$ to $T_0$.

The start time $T_s$ is commenced when a start button or switch 200 (FIG. 12A) is pushed. This activates pulse timer circuit 211, which is comprised of an off timer circuit 212, on timer circuit 213, and a gate timer circuit 214. The first portion of pulse timer circuit 211 to operate is off timer circuit 212. Circuit 212 runs for a fixed period of time, for example for 1.1 seconds, as shown in FIG. 1. At its conclusion, circuit 212 initiates three events:

a. An ejector, or loading, plunger (not shown) associated with the loaded carrier 16 is activated by an eject circuit 215 to cause the ejector to propel a wafer onto the air slide conveyor 75 down the leg 75B to the wafer pickup head position;

b. On timer circuit 213 is energized; and c. Gate timer circuit 214 is energized. Gate timer circuit 214 energizes the input wafer gate 89, unblocking load position "A" and blocking load position "B" after approximately 0.9 seconds more time has elapsed. By this time the first ejected wafer 11 has cleared gate 89 on its way to its pickup position. Input wafer gate 89 blocks load position "A" in its normally de-energized condition.

Also at this time, on timer circuit 213 energizes a stepping motor 216 to step carrier 16 to the position for ejection of a second wafer onto conveyor 75.

In order to place a second wafer in load position, the first 2-second period of the first cycle is now repeated. An "on timer complete" signal is routed through a mode select circuit 230 and a start control circuit 231 to restart off timer circuit 212, thereby causing pulse timer circuit 211 to recycle. Off timer circuit 212 operates again for 1.1 seconds, thereafter ejecting a second wafer 11 onto the air slide conveyor 75 and down the leg 75A to the pickup position. After its second operation, on timer circuit 213 energizes a wafer pickup circuit 219. Following a short period of time for wafer pickup by the pickup heads 25, 220 milliseconds in this case, sequence oscillator 220 is enabled and machine motion, the second cycle of operation, is initiated at time $T_0$.

The indexing and reciprocation mechanism, described in a previous section, operates during the second cycle, from $T_0$ to $T_1$. The upper line in this cycle (FIG. 11) depicts the indexing timing, while the lower line shows the timing of the motion of the radially reciprocating shafts 155. The mechanisms are stationary where the line is horizontal, and they are in motion where the lines are inclined. Hence, it is seen that at ⅛ second ($T_{01}$), or 125 ms after time $T_0$, the shafts 155 holding pickup heads 25 are retracted, and they finish extending at 125 ms before $T_1$ ($T_{03}$). Likewise, indexing occurs at the 187 ms period midway during the cycle while the shafts 155 are stationary, i.e. between $T_{03}$ and $T_{04}$.

Simultaneously, sequence oscillator 220 operates at time $T_0$ to initiate a series of six events culminating in the process operation of cycle No. 3. These events are:

1. At 42 milliseconds after time $T_0$ it resets a process timer circuit 223 and off timer circuit 212.
2. At 198 ms after Time $T_0$ it shifts a shift register 221. Register 221 and a photocell 84 cooperate to sense the presence of wafers going to pickup heads 25B, and to shift "wafer present" information serially to associate this information with the several process stations 50. A second photocell 85 (see FIG. 7) and shift register 221 (not shown) are employed for the "A" process stations. Only those stations will process that have wafers 11 present as determined by input data in shift register 221. Process timer circuit 223, controlled by register 221, controls a spray solenoid 225 which activates a valve in air supply line 185 to operate spray head 179 in the active process stations 50.
3. At 375 ms after time $T_0$, input data is transferred from the latch of photocell 84 to shift register 221 via a DC amplifier 232, and photocell 84 is reset.
4. At 520 ms after time $T_0$ all stations are checked for wafers present by sensing the logic level output of shift register 221.
5. At 688 ms after time $T_0$, a "machine stop" signal is initiated. Sequence oscillator 220 feeds a counter circuit (not shown) in a sequence control circuit 226 which, at 688 ms, generates a signal that operates a clutch-brake controller 227, picking clutch-brake 228, and stopping the machine at 750 ms.
6. At 750 ms after time $T_0$, process timer circuit 223 or a delay timer 224 is started. When the machine is properly programmed, wafer developing processes are timed to finish together, so that wet wafers will go immediately to the next process step. The indexing time of 750 milliseconds does not prove detrimental to normal processes.

Processing is commenced after the first two wafers have been picked up by heads 25 and transported into process stations 50A and 50B. This is indicated by the third cycle of FIG. 11 as beginning at time $T_1$.

Ordinarily it is desirable to transport the wafers from a develop process to a rinse process immediately upon completion of the develop process. A delay timer circuit 224 is employed for this purpose. If the develop process time is less than 4 seconds, delay timer 224 is energized for that amount of time less than 4 seconds as described in (6) above. It is seen that the process time is terminated at precisely $T_0$, when the indexing cycle No. 2 is ready to commence.

It is desired for the example of the timing of this machine, that the duration of cycle No. 2 be in the order of ¾ second, as explained before. This time is a function of intermittor motor characteristics, as well as those of the clutch and brake mechanisms. It is to be expected that this time will vary from machine to machine. Consequently, it has been found most useful that sequence oscillator 220 be adjustable over a wide range so that the cycle time can be set to match the true time for the machine to index.

It is seen in FIG. 11 that the total machine motion time per wafer is equal to the sum of the machine motion time, i.e. $T_0$–$T_1$, and the process time, i.e. $T_1$–$T_0$. At the completion of the machine motion cycle of 750 milliseconds, each of the eight cam lobes 145 is indexed 45° leaving pickup heads 25A and 25B each holding a wafer, in process position, when the process timing begins. Processing is stopped when process timer circuit 223 times out.

Wafer loading of the pickup heads 25 on all cycles subsequent to the first two loads occurs during the processing time $T_1$–$T_0$ (See FIG. 11). In this manner, wafer loading and processing are performed simultaneously, not serially. For the typical range of processing times, this makes for a faster machine operation.

When wafers are delivered to the unload station 15 by the pickup heads 25, a mechanical switch 237, interlocked with sequence control circuit 226, energizes circuit 226, sending a signal to wafer release circuit 233, whereupon two wafers are released by the pickup heads 25. This occurs at time $T_1$, at the completion of the index operation, cycle No. 2. The next operation of on timer circuit 213 terminates with exit wafer gate 90 being de-energized, permitting it to swing to a neutral position (see FIG. 4) after the "B" wafer has cleared it. Receiver carrier 17, being stepped in synchronism with sender carrier 16, is concurrently stepped to the next position in time for receipt of wafer "A", now released by gate 90 and enroute to carrier 17.

Where each wafer is processed serially first through the process stations 50B and then through the process stations 50A, a recirculating transfer valve 238 is employed for actuation of the reaction propelled elevator 58. Valve 238 is opened by a signal from on timer circuit 213 following each 0.9 second operational period of circuit 213.

A normal run, using a carrier full of wafers, is terminated by shutting the machine down when processing and indexing have been completed. Shift register 221 is continually checked by a test pulse from sequence control circuit 226. When this check indicates there are no more wafers on the pickup heads 25, and a position sensor 218 associated with receiver carrier 17 indicates the full position has been reached, an "AND" condition is generated and this information (not shown) shuts down the machine.

Thus the apparatus of the present invention provides means for automatically processing semiconductor wafers having sensitized lower surfaces, which processing is accomplished automatically without endangering personnel or without touching the wafers by hand.

It should be recognized that the apparatus of the present invention may also be used for automatically processing semiconductor wafers for such operations as chemical etch, surface clean or other operations upon a semiconductor wafer in which the lower surface of the wafer has not been sensitized. Thus, the term "processing" should be considered in its more broad aspect rather than limiting the apparatus specifically for use in processing semiconductor wafers having a sensitized lower surface.

Although the invention has been described with a certain degree of particularity, it is understood that the present disclosure has been made only by way of example and that numerous changes in the details of construction, the method of operation, and the combination and arrangement of parts made may be made without departing from the spirit and the scope of the invention as hereinafter claimed.

What is claimed is:

1. A machine for processing semiconductor wafers, said machine comprising: a table having a plurality of extensible wafer pickup heads arranged in sets; a plurality of sets of wafer process stations spaced from said table and each other; means to effect intermittent relative motion between said pickup heads and said process stations; means to align successively, from station to station, said process stations and said pickup heads whereby wafers held by one of the pickup heads of a set enter alternate ones of the process stations of the sets of process stations.

2. A machine in accordance with claim 1 including means in at least some of said sets of process stations to apply a spray of liquid to wafers supported by said pickup heads.

3. A machine in accordance with claim 1 wherein each of said sets of pickup heads includes means for extending said sets horizontally into and out of sets of process stations.

4. A machine in accordance with claim 1 wherein at least one of said sets of process stations includes a pair of chambers, said chambers including means to receive therein a pickup head of a set; and sealing means to seal a pickup head upon entry of the same into a chamber.

5. A machine in accordance with claim 4 including liquid spray means for contacting a photoresist sensitized surface of said wafer.

6. A machine in accordance with claim 5 including exhaust means for carrying away vapor from said liquid spray, and baffle means mounted in said chamber, said baffle means being positioned in said chamber to inhibit liquid overspray from entering said exhaust means.

7. A machine in accordance with claim 1 wherein each of said wafer pickup heads comprises a depending surface including means for applying a vacuum thereto, and means for shielding the side of said wafer held by said depending surface.

8. A machine in accordance with claim 1 including a wafer pickup head load station and a wafer pickup head unload station.

9. A machine in accordance with claim 8 wherein said wafer pickup head load station includes a first and second wafer receiving means for receiving wafers for pickup respectively by first and second wafer pickup heads of a set; and said wafer pickup head unload station includes a first and second wafer receiving means for receiving wafers from first and second wafer pickup heads of a set after said pickup heads have progressed through at least one of said sets of process stations.

10. A machine in accordance with claim 9 including shunt conveying means connecting one of said wafer receiving means associated with said wafer unload station and one of said wafer receiving means associated with said wafer load station, to shunt wafers received at said one wafer receiving means at said unload station to said load station.

11. A machine in accordance with claim 9 including shunt conveyor means connecting the first wafer receiving means at said load station and the second wafer receiving means at said unload station, said shunt conveyor means comprising an air slide; and elevator means at said first wafer receiving means for elevating wafers received from said air slide to a position adjacent to and underlying a wafer pickup head.

12. A machine in accordance with claim 11 wherein said elevator means includes a platform movable between a first position adjacent the discharge end of said shunt conveyor and a second position underlying a pickup head, and reaction jet means for propelling said platform between said first and second positions.

13. A machine in accordance with claim 12 wherein said platform includes means for receiving a wafer, and means for applying a film of air over said wafer receiving means to float said wafer on said film.

14. A machine in accordance with claim 12 including first and second stop means for limiting the travel of said platform between said first and second positions.

15. A machine in accordance with claim 8 including means for conveying wafers to said load station and means for conveying wafers from said unload station.

16. A machine in accordance with claim 15 wherein said wafer pickup head load station includes first and second wafer receiving means, and means on said conveying means for supplying wafers serially to said first and second receiving means.

17. A machine in accordance with claim 16 wherein said means for conveying wafers to said load station comprises bifurcated air slide means, and gate means for alternate shunting of wafers to said first and second wafer receiving means.

18. A machine in accordance with claim 15 wherein said pickup head unload station includes first and second wafer receiving means, and means on said conveying means for discharging wafers serially from said receiving means.

19. A machine in accordance with claim 18 wherein said means for conveying wafers from said unload station comprises bifurcated air slide means, and gate means for alternately discharging wafers from said first and second wafer receiving means.

20. Apparatus for processing semiconductor wafers, said apparatus comprising: a turntable and a plurality of radially reciprocable sets of pickup heads; a plurality of sets of process stations circumferentially spaced about said turntable; means for indexing said turntable and means for bringing at least some of said sets of pickup heads in some of said sets of process stations into registry during periods of dwell of said turntable, a wafer load station and means to introduce wafers into registration with said pickup heads at said wafer load station; an unload station, and means to receive wafers from said pickup heads at said unload station.

21. Apparatus in accordance with claim 20 wherein said process stations comprise a pair of chambers, each chamber including means for receiving therein of a set pickup head of a se of pickup heads, and means for sealing said chamber upon introduction of said head into said chamber.

22. Apparatus in accordance with claim 21 wherein at least one of said chambers includes means for dispensing a spray of liquid onto a wafer held by said pickup head.

23. Apparatus in accordance with claim 22 including exhaust means in said chamber for permitting discharge of vapor and fumes, and baffle means in said chamber, said baffle means being superimposed of the point of entry of said pickup head into said chamber to inhibit liquid spray leaving said chamber via said exhaust means.

24. Apparatus in accordance with claim 20 wherein said pickup means includes a vacuum chuck for gripping said wafer and means for protecting the side of said wafer held by said vacuum chuck at least upon said chuck entering said process stations.

25. Apparatus in accordance with claim 24 wherein said vacuum chuck comprises a protruding depending face portion means for applying a vacuum to said face portion; a recess circumscribing said face portion, and means for applying a positive flow of gaseous medium into said recess to thereby protect the side of said wafer held by said vacuum.

26. A machine for processing semiconductor wafers comprising; a plurality of sets of process stations; means for introducing one of said semiconductor wafers consecutively into one of the process stations of at least some of said sets; means for shifting said wafer introduced through said ones of the process stations of the sets so that said first mentioned means will consecutively introduce said wafer into a second station of at least some of said sets.

27. A machine for processing semiconductor wafers in accordance with claim 26 including a wafer load and wafer unload station, and shunt means for shunting some of said wafers from said unload station to said load station.

28. A machine in accordance with claim 27 including elevator means at said load station, said elevator operable between a first and second position; said first position to receive a wafer from said shunt means and said second position to position said wafer for gripping by said means for introducing said semiconductor wafers into said stations.

* * * * *

PO-1050 (5/69)

UNITED STATES PATENT OFFICE
CERTIFICATE OF CORRECTION

Patent No. 3,675,563 Dated July 11, 1972

Inventor(s) Claude G. Metreaud

It is certified that error appears in the above-identified patent and that said Letters Patent are hereby corrected as shown below:

Column 2, line 73: Delete "angular" and insert -- annular --

Claim 21, lines 7 and 8: Delete "of a set pickup head of a se" and insert -- a pickup head of a set --

Signed and sealed this 6th day of March 1973.

(SEAL)
Attest:

EDWARD M.FLETCHER,JR.
Attesting Officer

ROBERT GOTTSCHALK
Commissioner of Patents